United States Patent [19]
Chimura et al.

[11] Patent Number: 5,818,295
[45] Date of Patent: Oct. 6, 1998

[54] OPERATIONAL AMPLIFIER WITH STABILIZED DC OPERATIONS

[75] Inventors: Tsuyoshi Chimura, Kawaguchi; Masahiko Higashi, Ami-machi; Tatsumi Satoh, Hiji-machi, all of Japan

[73] Assignee: Texas Instruments Incorporated, Dallas, Tex.

[21] Appl. No.: 673,999

[22] Filed: Jul. 1, 1996

[30] Foreign Application Priority Data

Jun. 30, 1995 [JP] Japan ..................... 7-166475

[51] Int. Cl.⁶ .................. H03F 3/45; H03F 3/26
[52] U.S. Cl. .................. 327/561; 327/111; 330/253; 330/255; 330/257; 323/315
[58] Field of Search ..................... 330/253, 255, 330/257, 260, 288; 323/316, 315; 327/111, 561, 562, 538, 437

[56] References Cited

U.S. PATENT DOCUMENTS

| | | | |
|---|---|---|---|
| 4,730,168 | 3/1988 | Senderowicz et al. | 330/255 |
| 4,803,441 | 2/1989 | Noro | 330/257 |
| 5,034,700 | 7/1991 | Herrmann et al. | 330/255 |
| 5,113,129 | 5/1992 | Hughes | 323/315 |
| 5,115,187 | 5/1992 | Hayashi | 323/315 |
| 5,144,259 | 9/1992 | Yoshida | 330/255 |
| 5,504,458 | 4/1996 | Van Brunt et al. | 330/255 |
| 5,670,910 | 9/1997 | Kato | 330/253 |

FOREIGN PATENT DOCUMENTS

2 084 420   4/1982   United Kingdom ................ 330/255

*Primary Examiner*—Timothy P. Callahan
*Assistant Examiner*—Terry L. Englund
*Attorney, Agent, or Firm*—William B. Kempler; Richard L. Donaldson

[57] ABSTRACT

An operational amplifier with improved operational speed, as well as low power consumption, arranges a current mirror made of the pMOS transistors $PT_{17}$ and $PT_{18}$ in the stage after the initial-stage differential amplifier, supplies the output of the initial-stage differential amplifier to the gate of the nMOS transistor $NT_{14}$, supplies the current flowing through the current mirror to the output stage side by a current mirror made of the pMOS transistors $PT_{15}$ and $PT_{16}$, and lastly a pMOS transistor $PT_{19}$ is connected as a constant-current source between the supply line for the power supply voltage $V_{DD}$ and the node $ND_{12}$, and makes the idling current $I_{19}$ flow in the node $ND_{12}$. Due to this, stabilization of DC operations during normal states and when shifting its states can be designed without considering the characteristics in the vicinity of the threshold voltage of pMOS transistor $PT_{16}$, and thus stringent controls in the manufacturing process and the like are unnecessary.

7 Claims, 5 Drawing Sheets

OPERATIONAL AMPLIFIER WITH STABILIZED DC OPERATIONS

FIELD OF THE INVENTION

Our invention relates to operational amplifiers, and more particularly to operational amplifiers for use with liquid-crystal displays or the like.

BACKGROUND OF THE INVENTION

A conventional source driver integrated circuit for a thin-film transistor (TFT-type) LCD display samples and holds an analog input signal voltage, buffers the sampled voltage in an operational amplifier, and correspondingly drives the source terminals of the LCD display. The operational amplifier used in such a source driver must be able to quickly charge the LCD (liquid crystal display) panel's capacitance of several hundred picofarads. As there is a trend toward using large-sized LCD panels having multiple channels, each channel having at least one operational amplifier, such amplifiers must be made very small.

A conventional CMOS operational amplifier is shown in FIG. 8, in which $PT_{11}$ to $PT_{16}$ are pMOS transistors, $NT_{11}$–$NT_{13}$ are nMOS transistors, and $I_{11}$ and $I_{12}$ are current sources.

The sources of pMOS transistors $PT_{11}$ and $PT_{12}$ are connected together, the sources of pMOS transistors $PT_{13}$–$PT_{16}$ are connected to supply voltage $V_{DD}$, and the sources of the nMOS transistors $NT_{11}$–$NT_{13}$ are connected to ground.

A high gain, initial stage differential amplifier is formed as follows. The gate of pMOS transistor $PT_{11}$ is connected to an input terminal $T_{IN}$ for receiving an input signal IN, and the gate of pMOS transistor $PT_{12}$ is connected for negative feedback to an output-side node $ND_{12}$. The drains of $PT_{11}$ and nMOS transistor $NT_{11}$ are connected at node $ND_{11}$, and the drains of $PT_{12}$ and nMOS transistor $NT_{12}$ are also connected together. The gates of $NT_{11}$ and $NT_{12}$ are connected to each other and to the drain of $NT_{12}$. The output of this differential amplifier at node $ND_{11}$ is connected to the gate of nMOS transistor $NT_{13}$ in an output amplifier stage.

The output amplifier stage is formed by connecting together the drains of pMOS transistor $PT_{16}$ and nMOS transistor $NT_{13}$ at output-side node $ND_{12}$ which is connected to an output terminal $T_{OUT}$.

In the initial stage, a current mirror is formed by connecting the gates of $PT_{13}$ and $PT_{14}$ to each other, to the drain of $PT_{13}$, and to current source $I_{11}$. The drain of pMOS transistor $PT_{14}$ is connected to the common connecting point for the sources of $PT_{11}$ and $PT_{12}$ of the differential amplifier. This current mirror supplies a constant current to the differential amplifier.

Similarly, in the output amplifier stage a current mirror is formed by connecting the gates of pMOS transistors $PT_{15}$ and $PT_{16}$ to each other, to the drain of $PT_{15}$, and to current source $I_{12}$. This current mirror supplies a constant current to the output amplifier stage. The output of the differential amplifier at node $ND_{11}$ determines whether the gate of $NT_{13}$ switches that transistor OFF (for VIN>VOUT) or ON (for VIN≦VOUT), thereby controlling whether this constant current primarily flows into a capacitive external load (not shown) attached to terminal $T_{OUT}$ or is shunted to ground via the drain and source of $NT_{13}$.

In the differential amplifier, the gate of $PT_{11}$ forms the noninverting input and the gate of $PT_{12}$ forms the inverting input. Because the differential amplifier's inverting input is connected to the output terminal $T_{OUT}$ of the overall operational amplifier, the operational amplifier has a gain of "1."

A capacitor $C_{11}$ is connected between the gate and drain of nMOS transistor $NT_{13}$ of the output stage to provide phase compensation.

Thus, the conventional operational amplifier of FIG. 8 receives an input signal voltage $V_{IN}$ at a high impedance input terminal $T_{IN}$ and outputs the same voltage as an output signal voltage $V_{OUT}$ at a low impedance output terminal $T_{OUT}$. Because the output stage is constant current driven, it is a class A operational amplifier.

Its output with $NT_{13}$ ON can quickly discharge a load capacitance, but its charging speed with $NT_{13}$ OFF is limited by the constant current value of the current mirror made of transistors $PT_{15}$ and $PT_{16}$. To obtain a high charging speed, the constant current must be made large. Because this current continues to flow even after the output voltage becomes equal to the input voltage ($NT_{13}$ goes ON), this conventional circuit's current consumption is large.

To reduce current consumption, the circuit of FIG. 9 having separate, parallel amplifiers $AMP_A$, $AMP_B$ respectively for charging and discharging has been proposed. However, because this circuit requires two substantial amplifiers per channel and switches $SW_{11A}$, $SW_{12A}$, $SW_{11B}$ and $SW_{12B}$ for switching between them, it is difficult to keep small.

Therefore, it is an object of our invention to provide a small operational amplifier with improved operating speed and low power consumption.

SUMMARY OF INVENTION

An operational amplifier of our invention has a first current source that supplies a first and second current in a proportional relationship, a second current source that supplies a third current, a constant current means that keeps the sum of the second and third current constant, a first transistor that charges or discharges the output terminal at a current made proportional to the third current, a second transistor that charges or discharges the output terminal in response to an input signal, a third transistor that controls the value of the first current to have a relationship wherein it is made proportional to the current flowing in the second transistor in response to the input signal, and a third current source that supplies a fourth to the output terminal at least in a normal state, during neither charging nor discharging.

Also, the operational amplifier of our invention has a first current source that supplies a first and second current in a proportional relationship, a second current source that supplies a third current, a constant current means that keeps the sum of the second and third current constant, a first transistor that charges or discharges the output terminal at a current made proportional to the third current, a second transistor that charges or discharges the output terminal in response to an input signal, a third transistor that controls the value of the first current to have a relationship wherein it is made proportional to the current flowing in the second transistor in response to the input signal, and a circuit that limits the first current during charging.

According to the operational amplifier of our invention, since there is a proportional relationship between the first and second current flowing through a second transistor, the sum of the second and third current is constant, there is a proportional relationship between the third current and the current flowing through the first transistor, the current flowing through the second transistor increases, the third current is reduced due to the increase in the first and second current, and the current flowing through the first transistor is reduced.

In contrast to this, if the current flowing through the second transistor is reduced, the third current is increased due to the decrease in the first and second current, and the current flowing through the first transistor is increased. This circuit charges and discharges the output terminal with a class-AB operation.

Also, at least during normal operations, the so-called idling current is supplied by a third current source to the output terminals.

In this case, if consideration is given to a case in which the third current source is nonexistent, during normal states, the small amount of current that is equivalent to the idling current must be made to flow by the first transistor.

Originally, to increase the rising speed of the output voltage during discharging, i.e. throughput, the transistor size of the first transistor was designed to be large. At this time, to make a very small amount of current flow by the first transistor, the first transistor has to operate in the vicinity of the threshold voltage.

This fact meant that if the threshold voltage of the first transistor varied depending on the state of the process, it became extremely unstable from the standpoint of the circuit.

In contrast to this, due to the fact that there is a third current source, stable operation becomes possible without considering the characteristics in the vicinity of the threshold voltage of the first transistor.

Also, during discharging, the upper limit of the first current is kept from being becoming extremely large, and the current consumption is restrained.

In the figures, $PT_{11}$–$PT_{19}$, $PT_{11a}$–$PT_{16a}$, $PT101$–$102$, $PT11A$–$13A$, $PT11B$–$16B$ are pMOS transistors, $NT_{11}$–$NT_{16}$, $NT_{11a}$–$NT_{19a}$, $NT101$–$103$, $NT13A$–$16A$ are nMOS transistors, $C_{11}$ and $C_{11a}$ are phase compensating circuits, and $I_{11}$, $I_{11a}$, $I_{12}$ are current sources.

DETAILED DESCRIPTION

Embodiment 1

Figure 1:
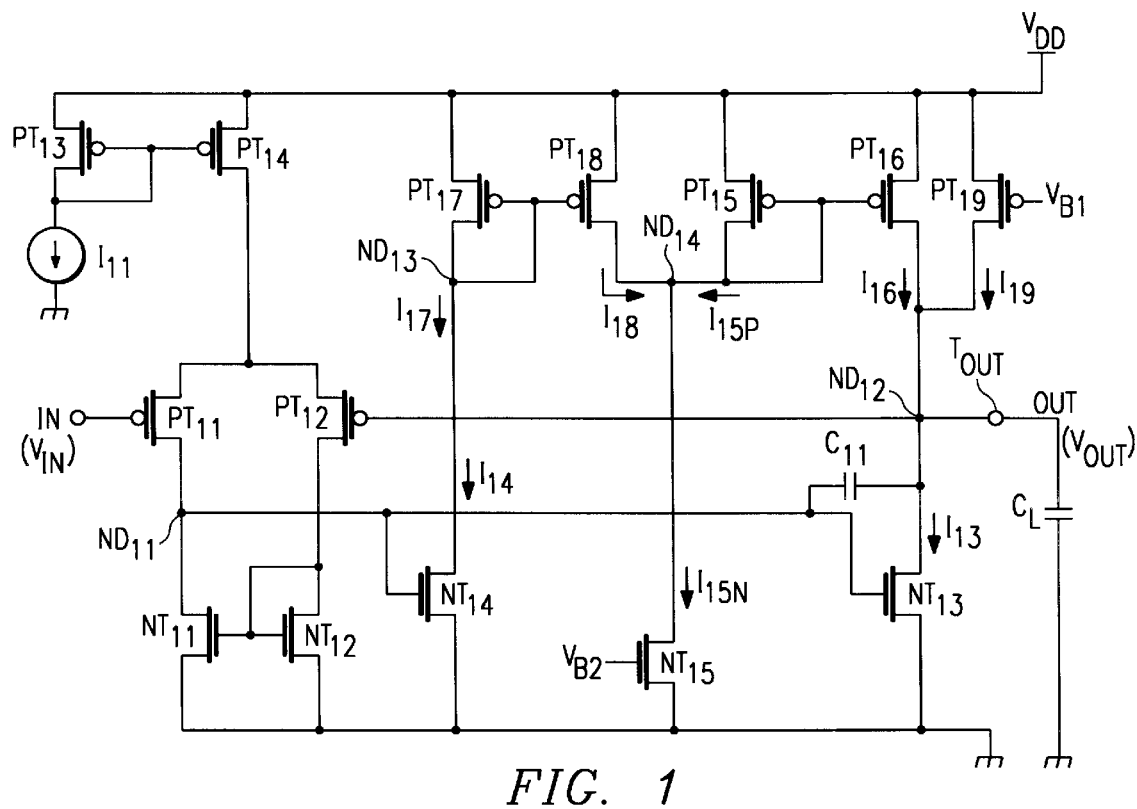
FIG. 1 is a schematic of a first embodiment of an operational amplifier according to our invention.
Figure 8:
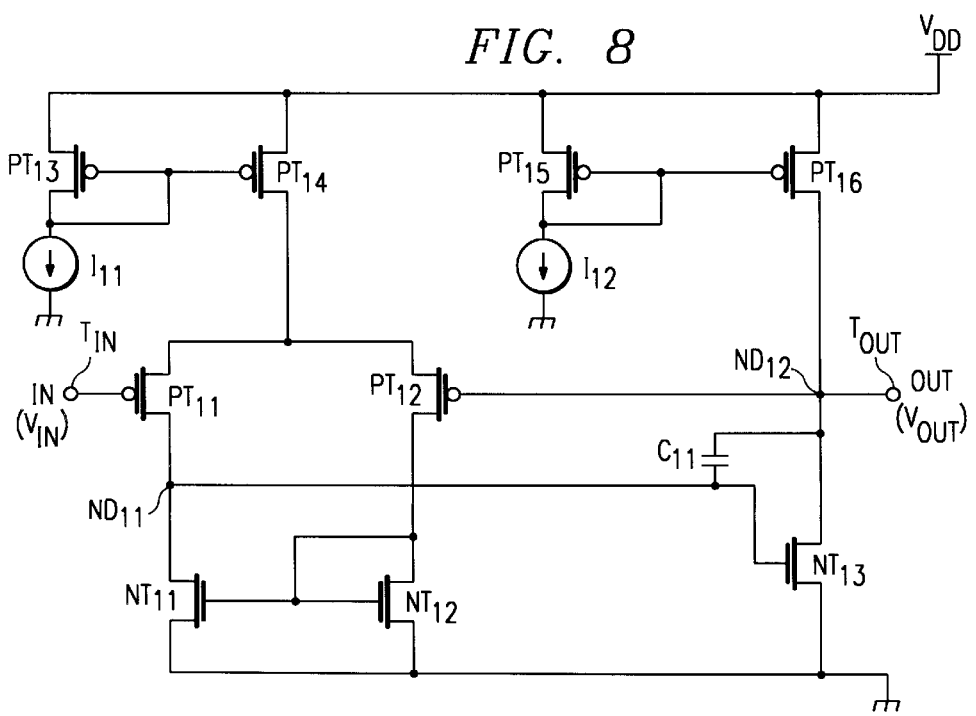
FIG. 8 is a schematic of a conventional CMOS operational amplifier.
Figure 9:
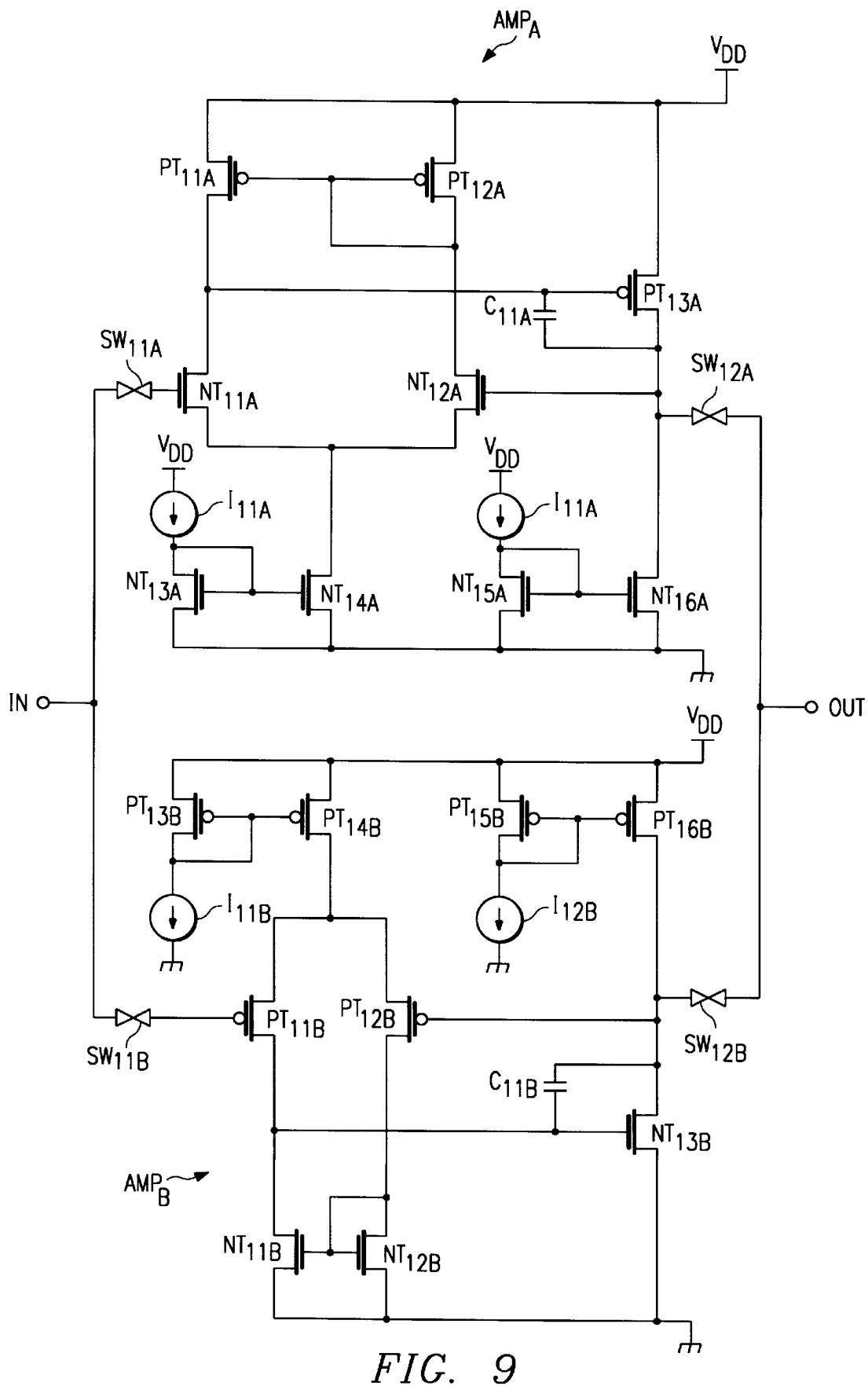
FIG. 9 is a schematic of a conventional CMOS operational amplifier having an amplifier for charging and an amplifier for discharging.

FIG. 1 shows a first embodiment of a CMOS operational amplifier according to our invention, in which parts the same as those in FIG. 8 have the same reference numerals.

An input terminal $T_{IN}$ receives an input signal $V_{IN}$ and an output terminal $T_{OUT}$ provides an output signal $V_{OUT}$ to a capacitive external load $C_L$. $PT_{11}$–$PT_{19}$ are pMOS transistors, $NT_{11}$–$NT_{15}$ are nMOS transistors, $I_{11}$ is a current source, and $C_{11}$ is a phase compensating capacitor.

A high gain, initial-stage differential amplifier like that in FIG. 8 receives the input voltage $V_{IN}$ at the gate of $PT_{11}$ from input terminal $T_{IN}$ and the feedback signal $V_{OUT}$ at the gate of $PT_{12}$ from an output node $ND_{12}$ coupled to output terminal $T_{OUT}$. The initial-stage differential amplifier's output at node $ND_{11}$ is supplied to the gates of an nMOS transistor switch $NT_{14}$ and an output stage nMOS transistor switch $NT_{13}$. The drain current $I_{14}$ of $NT_{14}$ is the control current $I_{17}$ for a current mirror formed by pMOS transistors $PT_{17}$ and $PT_{18}$.

Another current mirror made of pMOS transistors $PT_{15}$ and $PT_{16}$ supplies the drain current of $PT_{16}$ to output node $ND_{12}$ connected to output terminal $T_{OUT}$.

The pMOS transistor $PT_{19}$ is connected as a constant-current source between supply voltage $V_{DD}$ and output node $ND_{12}$ so that it maintains a constant idling current $I_{19}$ into output node $ND_{12}$. The gate of pMOS transistor $PT_{19}$ is connected to a constant reference voltage $V_{B1}$.

The sources of mirror transistors $PT_{17}$ and $PT_{18}$ are connected to supply voltage $V_{DD}$, their gates are connected to each other, to the drain of $PT_{17}$ (node $ND_{13}$), and to the drain of $NT_{14}$.

The drains of transistors $PT_{18}$ and $PT_{15}$ are connected to each other to form node $ND_{14}$, which is also connected to the gates of mirror transistors $PT_{15}$ and $PT_{16}$ and the drain of nMOS transistor $NT_{15}$. Because the source of $NT_{15}$ is connected to ground and its gate to a constant reference voltage $V_{B2}$, $NT_{15}$ maintains a constant drain current $I_{15}$. Lastly, the source of nMOS transistor $NT_{14}$ is connected to ground and its gate to node $ND_{11}$.

Figure 2:
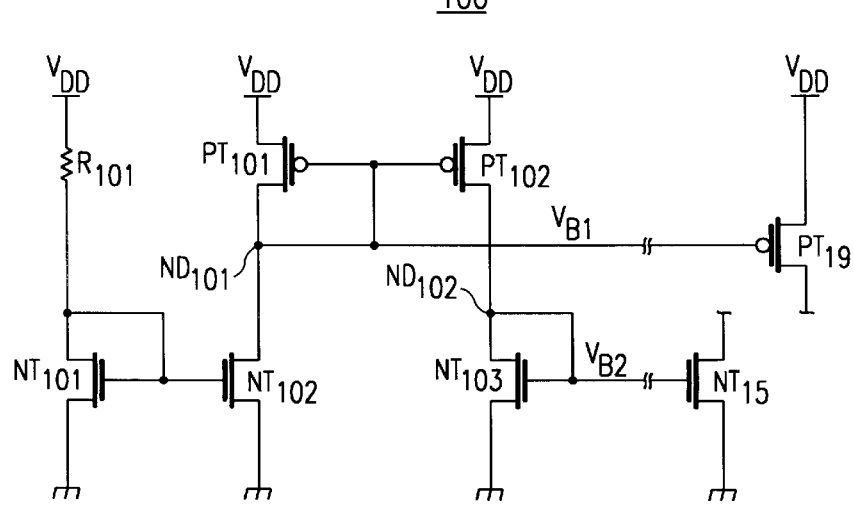
FIG. 2 is a schematic of an embodiment of a constant-voltage supply circuit according to our invention.

FIG. 2 is a schematic of a constant-voltage supply circuit 100 that supplies constant reference voltages $V_{B1}$, $V_{B2}$ respectively to the gates of transistors $PT_{19}$ and $NT_{15}$ to make them work as constant current sources. It has a resistor $R_{101}$, pMOS transistors $PT_{101}$ and $PT_{102}$, and nMOS transistors $NT_{101}$–$NT_{103}$. Resistor $R_{101}$ and nMOS transistor $NT_{101}$, pMOS transistor $PT_{101}$ and nMOS transistor $NT_{102}$, and pMOS transistor $PT_{102}$ and nMOS transistor $NT_{103}$ are each respectively connected in series between supply voltage $V_{DD}$ and ground.

Also, the connecting point for the resistor $R_{101}$ and the drain of $NT_{101}$ is connected to the gates of nMOS transistors $NT_{101}$ and $NT_{102}$. Also, the common connecting point for $ND_{101}$ for the drains of $PT_{101}$ and $NT_{102}$ is connected to the gates of the pMOS transistors $PT_{101}$ and $PT_{102}$, which form a current mirror. The potential of this node $ND_{101}$ is supplied as the constant voltage $V_{B1}$ to the gate of the pMOS transistor $PT_{19}$.

The common connecting point node $ND_{102}$ for the drains of transistors $PT_{102}$ and $NT_{103}$ is connected to the gate of the nMOS transistor $NT_{103}$, and its voltage is supplied to the gate of nMOS transistor $NT_{15}$ as the constant voltage $V_{B2}$.

Load Charging ($V_{IN}$>$V_{OUT}$)

Now the working of my operational amplifier of FIG. 1 will be described. During charging of the load $C_L$, because $V_{IN}$>$V_{OUT}$ the voltage at $ND_{11}$ drops near ground (0 V), cutting OFF nMOS transistor switches $NT_{13}$ and $NT_{14}$. This causes the current $I_{17}$ flowing through the pMOS transistor $PT_{17}$ to approach 0.

The current $I_{18}$ flowing in the drain of transistor $PT_{18}$ of the current mirror formed by $PT_{17}$ and $PT_{18}$ is proportional to the size ratio of pMOS transistors $PT_{17}$ and $PT_{18}$:

$$I_{18} = \{(W_{18}/L_{18})/(W_{17}/L_{17})\} \cdot I_{17} \tag{Eq. 1}$$

where $W_{18}$ and $W_{17}$ are the transistors' respective channel widths and $L_{18}$ and $L_{17}$ the respective channel lengths.

Because current $I_{17}$ approaches 0, the current $I_{18}$ also approaches 0. Then since current $I_{15N}$ flowing in the drain of $NT_{15}$ is constant, $I_{15P}=I_{15N}$; i.e. almost 100% of current $I_{15N}$ flows in pMOS transistor $PT_{15}$.

Also, because $PT_{15}$ and $PT_{16}$ also make up a current mirror:

$$I_{16}=\{(W_{16}/L_{16})/(W_{15}/L_{15})\}\cdot I_{15P}=\{(W_{16}/L_{16})/(W_{15}/L_{15})\}\cdot I_{15N} \quad (Eq.\ 2)$$

Then the output current $I_{OUT}$ to the output terminal $T_{OUT}$ becomes:

$$I_{OUT}=I_{16}+I_{19}=\{(W_{16}/L_{16})/(W_{15}/L_{15})\}\cdot I_{15N}+I_{19} \quad (Eq.\ 3)$$

Thus, if transistor $PT_{16}$ is made large in relation to $PT_{15}$ it can deliver to the load an output current which is a substantial multiple $\{(W_{16}/L_{16})/(W_{15}/L_{15})\}$ of the constant current $I_{15N}$. For example, the idling current $I_{19}$ due to the pMOS transistor $PT_{19}$ that acts as a constant-current source during this charging can be about 4.8 $\mu$A, and the drain current $I_{16}$ of pMOS transistor $PT_{16}$ during charging about 280 $\mu$A.

Load Discharging ($V_{IN}<V_{OUT}$)

Next, suppose that after the capacitive load $C_L$ has been charged, the input signal $V_{IN}$ next drops to less than $V_{OUT}$, so the capacitive load must be discharged. Then because $V_{IN}<V_{OUT}$, the voltage at $ND_{11}$ rises above the threshold voltages of nMOS transistor switches $NT_{13}$ and $NT_{14}$, causing them to switch ON, so that respective drain currents $I_{13}$ and $I_{14}$ flow. Further, let us assume that nMOS transistors $NT_{13}$ and $NT_{14}$ are the same size transistors.

In this way, corresponding currents $I_{15P}$ and $I_{18}$ will flow into node $ND_{14}$ from $PT_{15}$ and $PT_{18}$, which respectively belong to the two current mirrors $PT_{15}$–$PT_{16}$ and $PT_{17}$–$PT_{18}$.

Because transistor $NT_{15}$ has its source at ground and its gate is supplied with a constant voltage $V_{B2}$, it has a constant drain current $I_{15N}$. Constant current $I_{15N}$ is the sum of drain currents $I_{18}$ of $PT_{18}$ and $I_{15P}$ of $PT_{15}$ flowing into note $ND_{14}$: Therefore, $$I_{15N}=I_{18}+I_{15P} \quad (Eq.\ 4)$$

$$I_{15P}=I_{15N}-I_{18} \quad (Eq.\ 5)$$

Because the current $I_{18}$ increases with an increase in the drain current $I_{14}$ of the nMOS transistor $NT_{14}$, the drain current $I_{15P}$ of the pMOS transistor $PT_{15}$ decreases.

In this case, as established in equation 6 listed below, the drain current $I_{15P}$ of the pMOS transistor $PT_{15}$ can be made almost 0 by appropriately setting the sizes of nMOS transistor $NT_{14}$ and pMOS transistors $PT_{17}$, $PT_{18}$, $PT_{15}$ and $PT_{16}$, so that $$I_{15N}=I_{18}=\{(W_{18}/L_{18})/W_{17}/L_{17})\}\cdot I_{17} \quad (Eq.\ 6)$$

Because drain current $I_{15P}$ of the pMOS transistor $PT_{15}$ is almost 0, the mirror drain current $I_{16}$ of large transistor $PT_{16}$ is also reduced and approaches 0, substantially reducing the operational amplifier's current consumption.

As a result, the "intake" current entering node $ND_{12}$ from output terminal $T_{OUT}$ becomes $I_{13}$–$I_{19}$. Assuming $I_{19}$ is relatively small compared to $I_{13}$, the capacitive load $C_L$ can be quickly discharged by the switching ON of transistor $NT_{13}$.

For example, during discharge the idling current $I_{19}$ can be about 4.8 $\mu$A, the drain current $I_{16}$ of transistor $PT16$ about 0 $\mu$A, and current $I_{19}$ a substantially larger value determined by the voltage to which capacitor $C_L$ has been charged and the internal resistance of transistor $NT_{13}$.

Normal State ($V_{IN}=V_{OUT}$, No Charging or Discharging)

Next, we consider a normal state when $V_{OUT}=V_{IN}$, so the output load $C_L$ is neither being charged nor discharged. In that case, there is no current flowing to or from the load $C_L$. Therefore, the initial-stage differential amplifier must set its output node $ND_{11}$ at a voltage just high enough to causes the drain current $I_{13}$ of transistor $NT_{13}$ to equal the sum of drain currents $I_{16}$ and $I_{19}$.

If we assume $I_{16}$ is still very small relative to $I_{19}$ in this state, then $I_{13} \approx I_{19}$. In fact, the value of idling current $I_{19}$ due to transistor $PT_{19}$ during this normal state, as well as the drain current $I_{16}$ of transistor $PT_{16}$, can be about the same as during discharging. For example, idling current $I_{19}$ can be about 4.8 $\mu$A, and drain current $I_{16}$ of the pMOS transistor $PT_{16}$ about 0 $\mu$A.

Now, in the circuit of FIG. 1, let us consider the case where the constant-current source realized by pMOS transistor $PT_{19}$ does not exist. Then in the normal state when $V_{OUT}=V_{IN}$, a very small current equivalent to idling current $I_{19}$ must flow in the drain of pMOS transistor $PT_{16}$.

Originally, to increase the rising speed of the output voltage during charging when $V_{IN}>V_{OUT}$, i.e. throughput, the transistor size of the pMOS transistor $PT_{16}$ was made large in relation to pMOS transistor $PT_{15}$. And to make a very small current flow during the normal state in transistor $PT_{16}$, it is necessary to operate pMOS transistor $PT_{16}$ in the vicinity of its threshold voltage. But if the threshold voltage of $PT_{16}$ varies depending on other process conditions, the operational amplifier becomes extremely unstable.

Therefore, the constant current source transistor $PT_{19}$ enables stable operation to be realized without considering the characteristics of pMOS transistor $PT_{16}$ in the vicinity of its threshold voltage.

Figure 3:
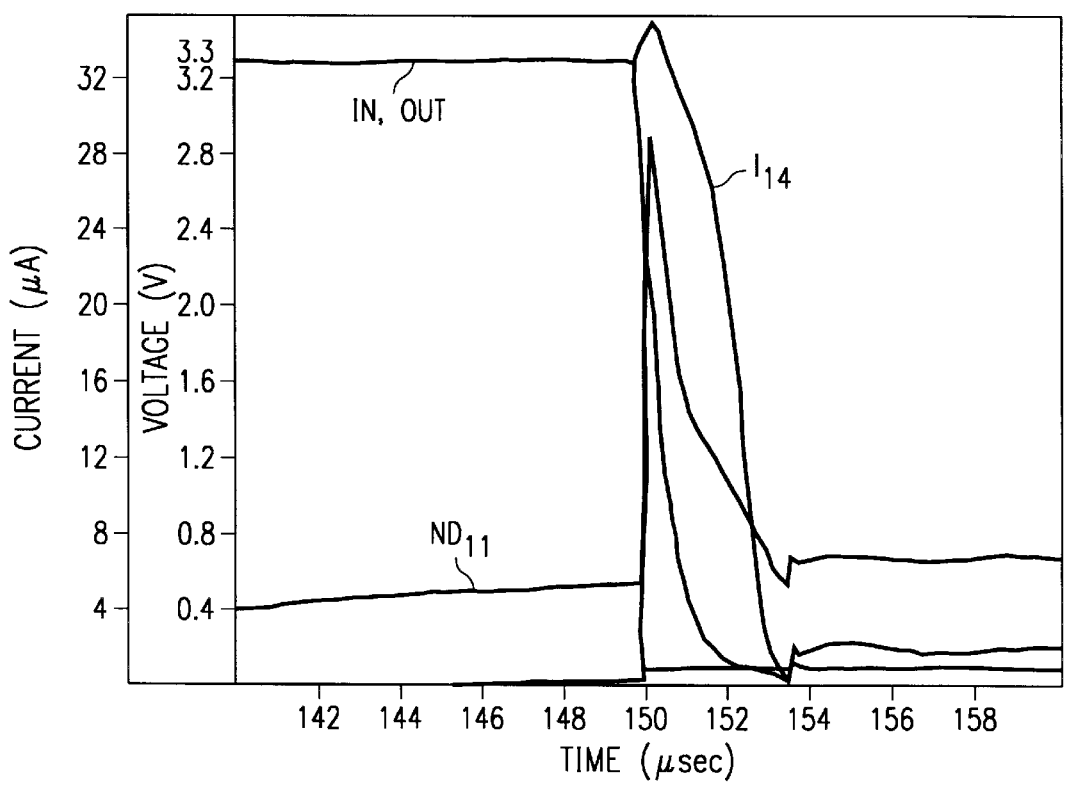
FIG. 3 is a current vs. time graph of the simulation effects of the operational amplifier of FIG. 1.

A graph of simulation results for the characteristics of the circuit of FIG. 1 are shown in FIG. 3. The simulation shows that this circuit can obtain nearly perfect amplifier characteristics.

Embodiment 2

Figure 4:
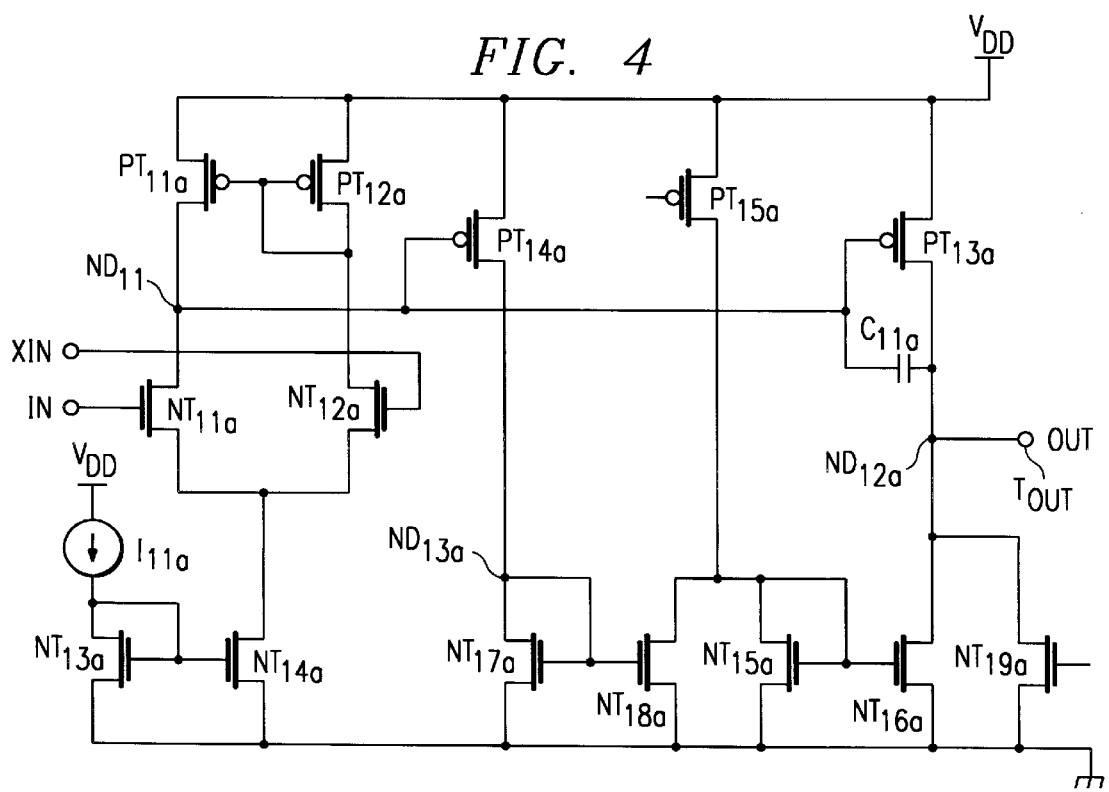
FIG. 4 is a schematic of a second embodiment of an operational amplifier according to our invention.

FIG. 4 shows a second embodiment of an operational amplifier according to our invention. In this circuit, the polarity of each transistor is reversed from that of FIG. 1. It uses n-channel transistors in place of the p-channel transistors and p-channel transistors used in place of n-channel transistors of FIG. 1. To work like the circuit of FIG. 1, the IN(−) inverting input must be connected to output terminal $T_{OUT}$, and suitable constant voltages $V_{C1}$ and $V_{C2}$ must be provided, for example by a constant voltage supply circuit which reverses the polarity of the transistors and voltages of the supply circuit of FIG. 2. An explanation of connection relationships and operation is omitted because adjusting for polarity these are about the same as in the first embodiment.

Embodiment 3

Figure 5:
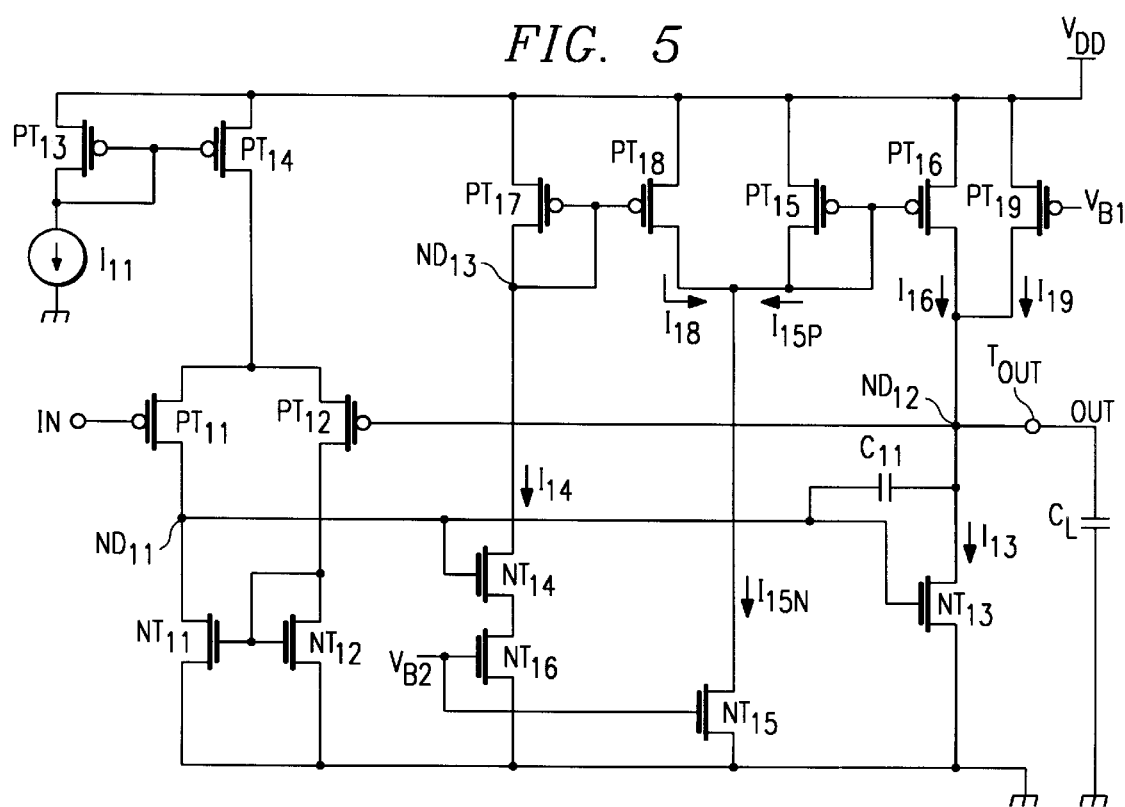
FIG. 5 is a schematic of a third embodiment of an operational amplifier according to our invention.

FIG. 5 shows a third embodiment of an operational amplifier which differs from the first embodiment in that an nMOS transistor $NT_{16}$, the gate of which is connected to the supply line for the fixed voltage $V_{B2}$, is further provided between the source of the nMOS transistor $NT_{14}$ and the ground line as a current source used for current limiting during discharging.

If there is no nMOS transistor $NT_{16}$, during discharging when $V_{IN}<V_{OUT}$, especially in the case when the output voltage $V_{OUT}$ is much higher than $V_{IN}$, the gate voltage rises so that the nMOS transistor $NT_{13}$ can cause a large current to flow. At this time, a large current also flows in the nMOS transistor $NT_{14}$ with the same gate potential.

If the basic operations are considered, the following equation can be established.

$$I_{17} \cong \{(W_{17}/L_{17})/W_{18}/L_{18})\} \cdot I_{18} = I_{15N} \qquad (Eq. 7)$$

However, temporarily, current $I_{17}$ becomes an extremely large current compared to $I_{15N}$.

This fact is not desirable when viewed from the standpoint of current consumption.

So that there are no problems from the standpoint of operation, within the meaning that the current $I_{17}$ is limited, a constant-current source made of nMOS transistor $NT_{16}$ is provided. This constant-current source is constructed to cause a slightly larger current than current $I_{15N}$ to flow.

Since a constant-current source is provided for minimizing the current consumption of that section without changing the operating characteristics, in addition to the effects of the first embodiment, the current consumption of the entire circuit can be further suppressed.

Figure 6:
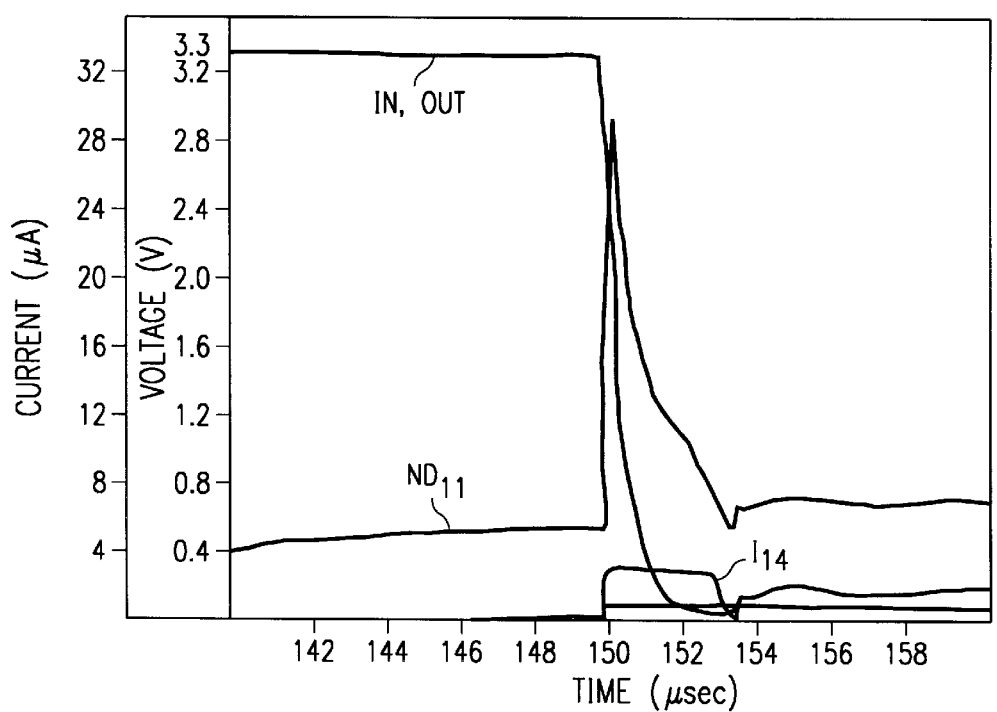
FIG. 6 is a current vs. time graph showing the simulation effects of the operational amplifier of FIG. 5.

Simulation results for the circuit characteristics of FIG. 5 are shown in FIG. 6.

As shown in FIG. 3, the circuit of FIG. 1 can obtain almost perfect amplification characteristics, but the circuit of FIG. 5 can obtain still better amplification characteristics as shown in FIG. 6.

In the construction of FIG. 5, in the circuit that provided a constant-current source used for the idling current of FIG. 1, a construction was made which added the nMOS transistor $NT_{16}$ as a current source used for a current limiter during discharge, but needless to say, low current consumption can still be realized even if it is a circuit that is not generally used as a constantcurrent source for idling current.

Embodiment 4

Figure 7:
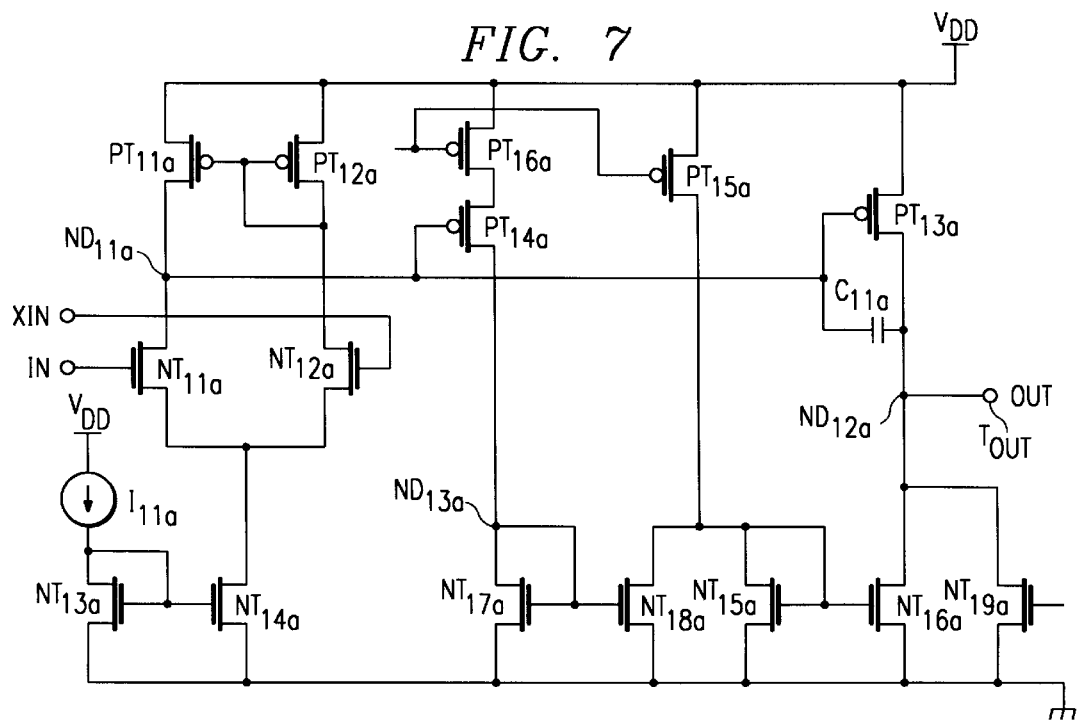
FIG. 7 is a schematic of a fourth embodiment of an operational amplifier according to our invention.

FIG. 7 is a schematic of a fourth embodiment of an operational amplifier according to our invention. Compared to the third embodiment, the polarity of each transistor is reversed. The n-channel transistors are used in place of the p-channel transistors in FIG. 5, and p-channel transistors are used in place of n-channel transistors.

The explanation regarding the specific connection relationships as well as the operation is omitted here because these are made in about the same manner as in the case of the first embodiment.

Even in this circuit, about the same effects as those of the third embodiment can be obtained.

Also, in each of the embodiments, an explanation was given using MOS transistors as an example, but needless to say, the same type of output circuit can be constructed using bipolar transistors.

As explained above, since the operational amplifier of our invention operates as a class-AB operation, a large current is output only during the charging and discharging of the load capacitor, and only a small current is output in the normal state wherein the charging and discharging of the load capacitor is not being conducted, and both a low power consumption and a high-speed operation can be realized. Also, since the provision of amplifiers used for charging and discharging is not individually necessary, there is the advantage that enlarging of the operational amplifier can be prevented.

Also, stabilization of DC operations during normal states and when shifting states can be designed without considering the characteristics in the vicinity of the threshold voltage of the first transistor. Because of this, there is the advantage that stringent controls in the manufacturing process and the like are unnecessary.

We claim:

1. An operational amplifier for driving a capacitive load, comprising:

a signal input terminal of voltage $V_{IN}$, and a power input terminal for a supply voltage;

an output terminal of voltage $V_{OUT}$ and a ground terminal, for coupling to the capacitive load:

a comparator responsive to $V_{IN}$ and $V_{OUT}$ for generating a control signal respectively indicating CHARGE, STANDBY, or DISCHARGE according to whether $V_{IN} > V_{OUT}$, $V_{IN} = V_{OUT}$, or $V_{IN} < V_{OUT}$;

a charging circuit, responsive to the comparator, (i) for drawing a charging current from the power input terminal into the output terminal when the control signal is CHARGE, and (ii) for quenching the drawing of charging current from the power input terminal when the control signal is STANDBY or DISCHARGE, wherein the charging circuit has a first current mirror for drawing the charging current from the power input terminal into the output terminal responsive to a second current mirror which quenches the first current mirror charging current when the control signal is STANDBY or DISCHARGE; and a shunting circuit, responsive to the comparator, for providing a shunt from the output terminal to ground whose resistance is (i) high when the control signal is CHARGE or STANDBY, and (ii) low when the control signal is DISCHARGE.

2. The operational amplifier of claim 1 further comprising:

a quenching circuit for generating a quench signal which is INACTIVE when the control signal is CHARGE, and ACTIVE when the control signal is STANDBY or DISCHARGE; and wherein the charging circuit draws the charging current from the power input terminal into the output terminal when the quench signal is INACTIVE and quenches the drawing of charging current from the power input terminal when the quench signal is ACTIVE.

3. The operational amplifier of claim 1 further comprising:

a quenching circuit for generating a quench signal which is INACTIVE when the control signal is CHARGE, and ACTIVE when the control signal is STANDBY or DISCHARGE; and wherein the shunting circuit provides the shunt from the output terminal to ground whose resistance is high when the quench signal is INACTIVE and low when the quench signal is ACTIVE.

4. The operational amplifier of claim 1 wherein the shunting circuit is stabilized by an idle circuit which continuously provides a constant idle current that is small relative to the charging current to the output terminal.

5. An operational amplifier comprising:

an input terminal for receiving an input signal;

a comparator responsive to said input signal for generating a control signal for controlling said operational amplifier in a CHARGE, STANDBY or DISCHARGE mode;

an output terminal for coupling to a capacitive load;

a first current mirror $PT_{17}$–$PT_{18}$ for supplying first and second currents in a proportional relationship;

a current source $PT_{15}$ for supplying a third current;

a constant current source $NT_{15}$ coupled to said current source for maintaining the sum of the second and third currents constant;

a first transistor $PT_{16}$ coupled to said current source for charging the capacitive load coupled to the output terminal at a current proportional to the third current;

a second transistor $NT_{14}$ coupled to said current mirror responsive to the input signal for controlling the charging of the capacitive load coupled to the output terminal;

wherein the first current is proportional to a current in the second transistor; and a third current source $P_{19}$ for supplying a constant idling current to the output terminal in a normal-state when the first transistor is not charging the capacitive load coupled to the output terminal.

6. An operational amplifier comprising:

an input terminal for receiving an input signal;

a comparator responsive to said input signal for generating a control signal for controlling said operational amplifier in a CHARGE, STANDBY or DISCHARGE mode;

a first current source for supplying first and second currents in a proportional relationship;

a second current source for supplying a third current;

constant current means coupled to said first and second current sources for maintaining the sum of the second and third currents constant;

a first transistor for charging a load coupled to an output terminal at a current proportional to the third current;

a second transistor for controlling the charging of the load in response to the control signal;

wherein the first current is proportional to a current flowing in the second transistor in response to the input signal; and a limiting circuit for limiting the first current during discharging.

7. An operational amplifier comprising:

an input terminal for receiving an input signal;

a comparator responsive to said input signal for generating a control signal for controlling said operational amplifier in a CHARGE, STANDBY or DISCHARGE mode;

an output terminal for coupling to a capacitive load;

a first current source for supplying first and second currents in a proportional relationship;

a second current source for supplying a third current;

constant current means coupled to said first and second current sources for maintaining the sum of the second and third currents constant;

a first transistor for charging the capacitive load at a current proportional to the third current;

a second transistor for controlling the charging of the capacitive load coupled to the output terminal in response to the input signal;

wherein the first current is proportional to a current flowing in the second transistor in response to the input signal;

a third current source for supplying a fourth current to the output terminal at least in a normal state, during neither charging nor discharging of the capacitive load; and a limiting circuit for limiting the first current during discharging.

* * * * *